(12) United States Patent
Hauptman

(10) Patent No.: US 6,882,156 B2
(45) Date of Patent: Apr. 19, 2005

(54) PRINTED CIRCUIT BOARD ASSEMBLY FOR AUTOMATIC TEST EQUIPMENT

(75) Inventor: Steven Hauptman, Camarillo, CA (US)

(73) Assignee: Teradyne, Inc., Boston, MA (US)

( * ) Notice: Subject to any disclaimer, the term of this patent is extended or adjusted under 35 U.S.C. 154(b) by 32 days.

(21) Appl. No.: 10/076,757

(22) Filed: Feb. 14, 2002

(65) Prior Publication Data

US 2003/0151883 A1 Aug. 14, 2003

(51) Int. Cl.$^7$ .......................... G01R 31/08; H05K 7/20
(52) U.S. Cl. ...................... 324/514; 324/512; 361/699
(58) Field of Search ................. 324/514, 512; 361/699

(56) References Cited

U.S. PATENT DOCUMENTS

| | | | | |
|---|---|---|---|---|
| 4,745,354 A | | 5/1988 | Fraser ........................ 324/73 |
| 4,749,943 A | * | 6/1988 | Black ......................... 324/754 |
| 5,099,908 A | | 3/1992 | Taraci et al. ................. 165/1 |
| 5,103,374 A | * | 4/1992 | Azar .......................... 361/689 |
| 5,349,499 A | | 9/1994 | Yamada et al. ............ 361/700 |
| 5,426,563 A | * | 6/1995 | Moresco et al. ........... 361/689 |
| 5,718,117 A | * | 2/1998 | McDunn et al. ............... 62/64 |
| 5,835,349 A | * | 11/1998 | Giannatto et al. .......... 361/701 |
| 5,920,457 A | | 7/1999 | Lamb et al. ................ 361/699 |
| 6,052,284 A | | 4/2000 | Suga et al. ................. 361/699 |
| 6,587,345 B1 | * | 7/2003 | Chu et al. .................. 361/719 |
| 6,731,327 B1 | * | 5/2004 | Kujawa et al. ............... 348/80 |

* cited by examiner

Primary Examiner—N. Le
Assistant Examiner—John Teresinski
(74) Attorney, Agent, or Firm—Teradyne Legal Department

(57) ABSTRACT

A printed circuit board assembly adapted for immersion cooling is disclosed. The assembly includes a first circuit board having a first device side with a first portion configured to mount a first plurality of semiconductor devices. A second circuit board having a second device side with a second portion configured to mount a second plurality of semiconductor devices is disposed in confronting parallel relationship to the first circuit board. The assembly further includes a border element interposed between the first and second boards and disposed around the respective first and second portions. The border element cooperates with the first and second boards to form a liquid-tight container. An inlet formed in the border receives an electrically nonconducting liquid that is subsequently discharged through an outlet.

11 Claims, 2 Drawing Sheets

PRINTED CIRCUIT BOARD ASSEMBLY FOR AUTOMATIC TEST EQUIPMENT

FIELD OF THE INVENTION

The invention relates generally to automatic test equipment, and more particularly to printed circuit board assemblies associated with automatic test equipment.

BACKGROUND OF THE INVENTION

Automatic test equipment often plays a critical role in the manufacture of semiconductor devices. The equipment provides semiconductor manufacturers with the ability to functionally test each device at the wafer and packaged-device levels. However, with this ability comes cost. Consequently, minimizing test costs is important to semiconductor manufacturers.

FIG. 1 illustrates a conventional semiconductor tester 10, including a computer workstation 12 and a testhead 14. The testhead houses an array of electronic circuit boards, often called "channel cards" 16 that provide the electronic circuitry 18 for individual "channels". The channels apply signals to and capture signals from one or more devices-under-test (DUTs) 20 mounted on a prober or handler 22. Usually, a manipulator (not shown) carries the testhead above the prober/handler during test. Consequently, the weight of the testhead is an important factor in determining the lifting capability of the manipulator. The cost of a manipulator typically rises with its lifting ability.

One of the problems often encountered when designing the channel cards involves how to cool them. Channel circuitry in modem testheads often generate 5 to 20 watts per chip. Conventionally, liquid-cooled cold plates having formed surfaces configured to match the surface topology of each board were adequate. However, with the tendency to pack more channel circuits into smaller chips on the boards, heat dissipation associated with the chips may overwhelm the cooling capacity for conventional cold plates. Moreover, cold plates tend to be heavy, comprising metal containers mounted to the surface of each board.

One possible alternative to the use of cold plates for cooling high-power circuit boards is to employ immersion cooling techniques. A common conventional technique immerses entire boards into cooling baths of electrically non-conductive coolant. While this scheme works well for its intended purposes, modem channel cards are often fairly large, requiring even larger "baths" to carry out the conventional technique. Moreover, the weight associated with the bath containers do not lend themselves to practical testhead applications.

A proposal described by Suga et al., in U.S. Pat. No. 6,052,284, addresses the bulkiness problem described above somewhat by employing a box-like case around a portion of a board where the channel card electronics are mounted. Each board has electronics mounted on both sides, with respective cases mounted on each side. In this manner, the case may be smaller than the overall board.

While this proposal may reduce the size of the conventional immersion cooled system, the weight involved in having multiple metal cooling cases on each board might be prohibitive for a test head housing between thirty to sixty boards. Excess weight associated with a testhead may require the use of more costly manipulators suited to the heavier loads. In addition, double sided circuitry on a single board limits the number of interconnects that are possible between the integrated circuits.

What is needed and previously unavailable is a lightweight board assembly configured for immersion cooling applications that has an increased interconnect area. The board assembly of the present invention satisfies these needs.

SUMMARY OF THE INVENTION

The printed circuit board assembly of the present invention provides a lightweight manner of implementing immersion cooling in a semiconductor testhead. By minimizing the weight involved in cooling many circuit boards inside the testhead, the expenses involved in employing manipulators for heavier loads may be reduced. This may substantially reduce test costs.

To realize the foregoing advantages, the invention in one form comprises a printed circuit board assembly adapted for immersion cooling. The assembly includes a first circuit board having a first device side with a first portion configured to mount a first plurality of semiconductor devices. A second circuit board having a second device side with a second portion configured to mount a second plurality of semiconductor devices is disposed in confronting parallel relationship to the first circuit board. The assembly further includes a border element interposed between the first and second boards and disposed around the respective first and second portions. The border element cooperates with the first and second boards to form a liquid-tight container. An inlet formed in the border receives an electrically nonconducting liquid that is subsequently discharged through an outlet.

In another form, the invention comprises automatic test equipment including a computer workstation and a testhead adapted for being carried by a manipulator. The testhead includes a plurality of printed circuit board assemblies, each including a first circuit board having a first device side with a first portion configured to mount a first plurality of semiconductor devices. A second circuit board having a second device side with a second portion configured to mount a second plurality of semiconductor devices is disposed in confronting parallel relationship to the first circuit board. Each assembly further includes a border element interposed between the first and second boards and disposed around the respective first and second portions. The border element cooperates with the first and second boards to form a liquid-tight container. An inlet formed in the border receives an electrically nonconducting liquid that is subsequently discharged through an outlet.

In a further form, the invention comprises a method including the steps of mounting the electronic devices on confronting sides of a pair of printed circuit boards, the circuit boards placed in a parallel stacked relationship; interposing a border between the circuit boards and around the electronic devices, the border cooperating with the boards to establish a liquidtight container; and immersing the electronic devices into an electrically nonconducting liquid inside the container.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The printed circuit board of the present invention provides an immersion cooling capability for automatic test equipment channel cards while maintaining lightweight board configurations. By minimizing the weight associated with the board assemblies, the testhead weight is manageable with a relatively inexpensive manipulator.

Figure 2:
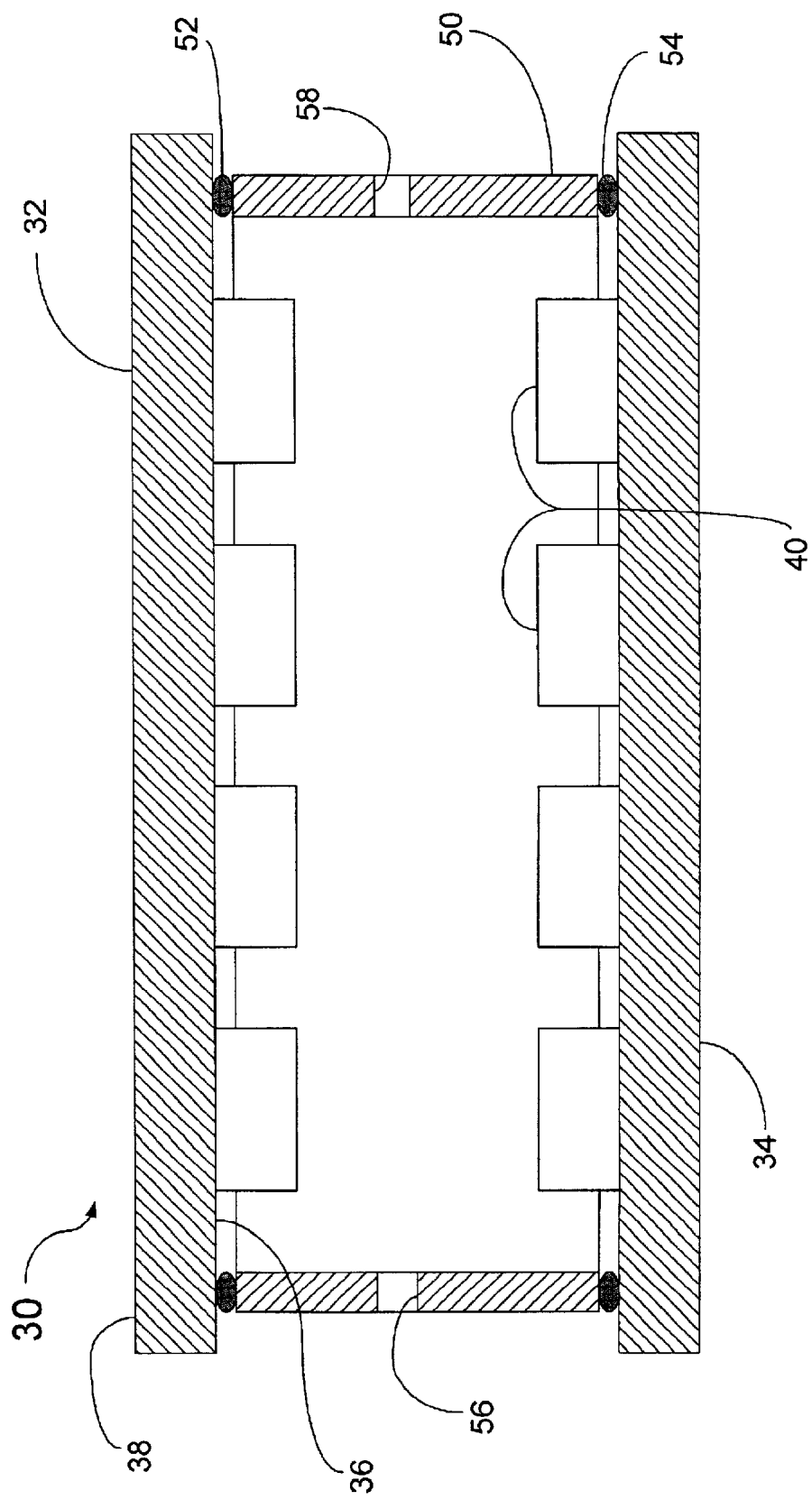
FIG. 2 is a partial cross-sectional view of a printed circuit board assembly according to one form of the present invention.

Referring to FIG. 2, the board assembly of the present invention, generally designated 30, includes respective first and second printed circuit boards 32 and 34 disposed in a spaced-apart parallel relationship. For purposes of clarity, only one board will be described in detail, with the understanding that both boards may or may not be configured as mirror images.

With continued reference to FIG. 2, the first board 32 comprises a laminated board substrate with a device side 36 and a routing side 38. The device side includes an area, or portion, that mounts a plurality of electronic devices 40, such as application-specific-integrated-circuits (ASICs) that form the channel circuitry for the individual channels. As an example, each channel card may mount the circuitry for between sixteen to sixty four channels. For high-channel count applications, the board may be of the multi-layered type, to enable sufficient routing space for device traces and signal paths. One edge of the board (not shown) provides a backplane connector interface for plugging the board into the testhead.

As stated above, the second board 34 is formed as a mirror image of the first board 32, and is disposed in spaced-apart parallel confronting relationship with the first board. In this manner, the two "portions" that mount the ASICs are directly opposite each other. The inventor has discovered that by placing the boards in this configuration, a minimum amount of metal in the form of a border 50 can be utilized to cooperate with the two boards to create an immersion cooling container.

With further reference to FIG. 2, the border 50 comprises a thin metallic element having a uniform height and a length sufficient to completely surround the device "portions" while forming an orthogonal wall interposed between the two boards. Preferably, the border comprises one or more "picture frames" and may be machined or cast into the required shape in accordance with known manufacturing methods. To effect a liquid-tight seal, top and bottom gaskets 52 and 54 are employed along the border edges. The gaskets and border may be mounted in place with a suitable adhesive, or clamped into place with clamping devices (not shown), or set into a retaining groove that is a part of the border. The border further includes an inlet 56 and outlet 58 for coupling to a coolant source (not shown) to provide the advantages of circulating the coolant through the board assembly.

Figure 1:
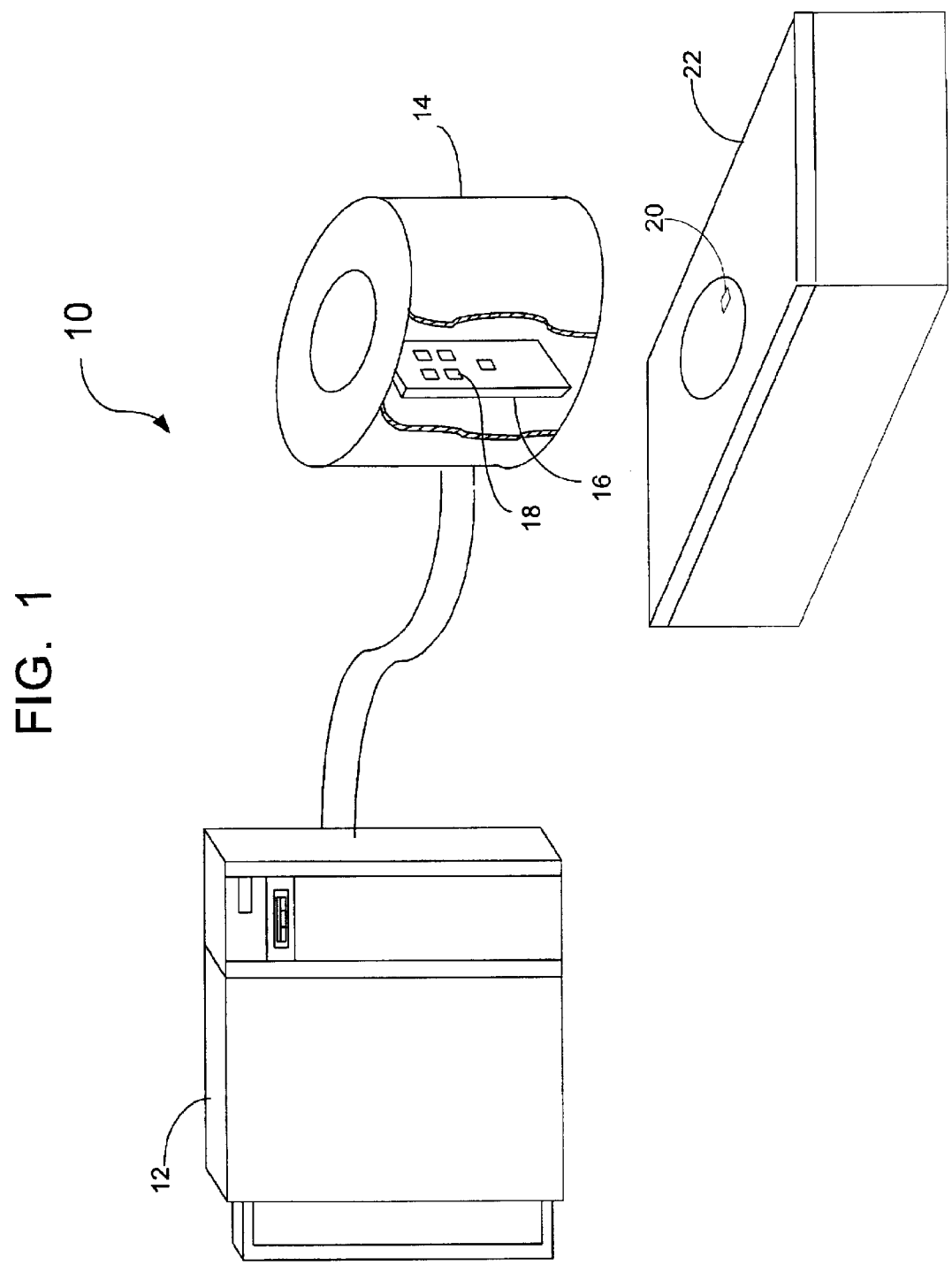
FIG. 1 is a high-level block diagram of a conventional semiconductor tester.

In operation, the board assembly 30 lends itself well as a substitute for conventional board assemblies 16 (FIG. 1) in semiconductor testers such as that shown in FIG. 1. During a test, the semiconductor testhead activates the channels necessary to carry out a test on one or more DUTs 20 (FIG. 1). The corresponding ASICs 40 for the activated channel circuitry consume power and dissipate heat in the localized "portions". Throughout the test, an electrically non-conductive coolant, such as that known under the trademark Flourinert™ is circulated through the inlet 56 and outlet 58 of the board assembly 30 at a constant rate, commensurate with the expected amount of heat dissipation. As a result, the boards maintain a relatively constant temperature without overheating the assembly, and potentially damaging the electronics.

Those skilled in the art will appreciate the many benefits and advantages afforded by the present invention. Of significant importance is the use of minimal metal to effect a liquid-tight immersion container for the channel card electronics. This reduces the weight of the channel cards, correspondingly reducing the weight of the testhead, and the lifting capacity required of the manipulator. As a result, less expensive manipulators may be employed. In addition, since multiple boards are used in place of a single board, additional routing layers are available for circuit interconnect in the same volume.

While the invention has been particularly shown and described with reference to the preferred embodiments thereof, it will be understood by those skilled in the art that various changes in form and detail may be made therein without departing from the spirit and scope of the invention.

What is claimed is:

1. A printed circuit board assembly including:
   a first circuit board having a first device side, the first device side having a first portion configured to mount a first semiconductor device;
   a second circuit board having a second device side, the second device side having a second portion configured to mount a second semiconductor device, the second circuit board disposed in confronting parallel relationship to the first circuit board; and
   a border interposed between the first and second boards and disposed around the respective first and second portions, the border forming with the first and second boards a liquid-tight chamber containing the first and second semiconductor devices, the border includes an inlet to receive an electrically nonconducting liquid into the chamber and an outlet for discharging the liquid from the chamber.

2. The assembly of claim 1 wherein the first and second circuit boards comprise channel cards for use in a semiconductor tester.

3. The assembly of claim 1 wherein the border comprises:
   a border element having a thin metallic wall of a uniform height and respective top and bottom sealing edges; and
   respective first and second seals disposed between the top and bottom sealing edges and the first and second device sides.

4. The assembly of claim 1 wherein the first and second printed circuit boards have devices mounted solely on the first and second device sides.

5. Automatic test equipment comprising:
   a testhead adapted for being carried by a manipulator, the testhead including a plurality of printed circuit board assemblies, each of the plurality of circuit board assemblies including:
   a first circuit board having a first device side, the first device side having a first portion configured to mount a first semiconductor device;
   a second circuit board having a second device side, the second device side having
   a second portion configured to mount a second semiconductor device; the second circuit board disposed in confronting parallel relationship to the first circuit board; and
   a border interposed between the first and second boards and disposed around the respective first and second portions, the border forming with the first and second boards a liquid-tight chamber containing the first and second semiconductor devices, the border including an inlet to receive an electrically nonconducting liquid into the chamber and an outlet for discharging the liquid from the chamber.

6. The automatic test equipment of claim 5 wherein the border comprises:

a border element having a thin metallic wall of a uniform height and respective top and bottom sealing edges; and respective first and second seals disposed between the top and bottom sealing edges and the first and second device sides.

7. The automatic test equipment of claim 5 wherein the first and second printed circuit boards have devices mounted solely on the first and second device sides.

8. A method comprising:

cooling electronic devices, cooling comprises:

mounting the electronic devices on confronting sides of a pair of printed circuit boards, the circuit boards placed in a parallel stacked relationship; and interposing a border between the circuit boards and around the electronic devices, the border with the boards forming a liquid-tight chamber containing the electronic devices, the border including an inlet to receive an electrically nonconducting liquid into the chamber and an outlet for discharging the liquid from the chamber.

9. The method of claim 8, further comprising discharging the electrically nonconducting liquid into the chamber.

10. The method of claim 9, further comprising immersing the electronic devices with the electrically nonconducting liquid with the chamber.

11. The method of claim 9, further comprising discharging the electrically nonconducting liquid from the chamber.

* * * * *